United States Patent
Lahiri et al.

(10) Patent No.: US 7,126,220 B2
(45) Date of Patent: Oct. 24, 2006

(54) MINIATURIZED CONTACT SPRING

(75) Inventors: Syamal Kumar Lahiri, Milpitas, CA (US); Frank Swiatowiec, San Jose, CA (US); Fu Chiung Chong, Saratoga, CA (US); Sammy Mok, Cupertino, CA (US); Erh-Kong Chieh, Cupertino, CA (US); Roman L. Milter, San Francisco, CA (US); Joseph M. Haemer, San Jose, CA (US); Chang-Ming Lin, San Jose, CA (US); Yi-Hsing Chen, San Jose, CA (US); David Thanh Doan, San Jose, CA (US)

(73) Assignee: NanoNexus, Inc., San Jose, CA (US)

( * ) Notice: Subject to any disclaimer, the term of this patent is extended or adjusted under 35 U.S.C. 154(b) by 0 days.

(21) Appl. No.: 10/390,988

(22) Filed: Mar. 17, 2003
(Under 37 CFR 1.47)

(65) Prior Publication Data
US 2003/0218244 A1  Nov. 27, 2003

Related U.S. Application Data

(60) Provisional application No. 60/365,625, filed on Mar. 18, 2002.

(51) Int. Cl.
*H01L 23/48* (2006.01)
*H01L 23/52* (2006.01)
*H01L 29/40* (2006.01)

(52) U.S. Cl. .................... 257/734; 257/761; 257/764
(58) Field of Classification Search ............. 439/66; 257/734, 761, 763, 774; 438/117

See application file for complete search history.

(56) References Cited

U.S. PATENT DOCUMENTS

| 5,166,774 | A | 11/1992 | Banerji et al. |
| 5,280,139 | A | 1/1994 | Suppelsa et al. |
| 5,476,211 | A | 12/1995 | Khandros |
| 5,613,861 | A | 3/1997 | Smith et al. |
| 5,763,941 | A | 6/1998 | Fjelstad |
| 5,917,707 | A | 6/1999 | Khandros et al. |
| 6,117,694 | A | 9/2000 | Smith et al. |
| 6,184,053 | B1 | 2/2001 | Eldridge et al. |
| 6,528,350 | B1 * | 3/2003 | Fork ..................... 438/117 |
| 6,616,966 | B1 * | 9/2003 | Mathieu et al. ........... 29/842 |
| 6,791,171 | B1 | 9/2004 | Mok |
| 6,799,976 | B1 | 10/2004 | Mok |
| 6,812,718 | B1 | 11/2004 | Moldoveanu |
| 6,815,961 | B1 | 11/2004 | Mok |
| 6,856,225 | B1 * | 2/2005 | Chua et al. ............. 336/192 |
| 2001/0009305 | A1 | 7/2001 | Fielstad |

(Continued)

FOREIGN PATENT DOCUMENTS

WO    WO 9744676    11/1997

(Continued)

*Primary Examiner*—Hoai Pham
*Assistant Examiner*—Mursalin Bin Hafiz
(74) *Attorney, Agent, or Firm*—Michael A. Glenn; Glenn Patent Group

(57) ABSTRACT

This invention provides a solution to increase the yield strength and fatigue strength of miniaturized springs, which can be fabricated in arrays with ultra-small pitches. It also discloses a solution to minimize adhesion of the contact pad materials to the spring tips upon repeated contacts without affecting the reliability of the miniaturized springs. In addition, the invention also presents a method to fabricate the springs that allow passage of relatively higher current without significantly degrading their lifetime.

25 Claims, 5 Drawing Sheets

U.S. PATENT DOCUMENTS

| | | | |
|---|---|---|---|
| 2001/0009724 A1 | 7/2001 | Chen et al. | |
| 2001/0021483 A1* | 9/2001 | Mathieu et al. | 430/311 |
| 2002/0055282 A1* | 5/2002 | Eldridge et al. | 439/66 |
| 2002/0164893 A1* | 11/2002 | Mathieu et al. | 438/66 |

FOREIGN PATENT DOCUMENTS

| | | |
|---|---|---|
| WO | WO 0109952 | 2/2001 |
| WO | WO 0148818 | 7/2001 |
| WO | WO 0148870 | 7/2001 |
| WO | PCT/US02/26785 | 8/2002 |
| WO | WO 03/018865 | 3/2003 |
| WO | WO 03/061725 | 7/2003 |

* cited by examiner

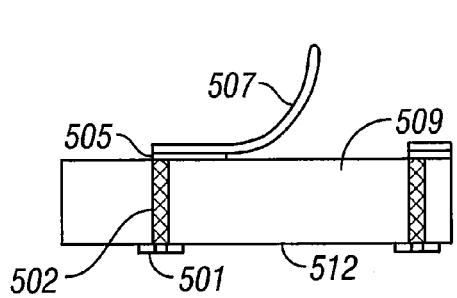
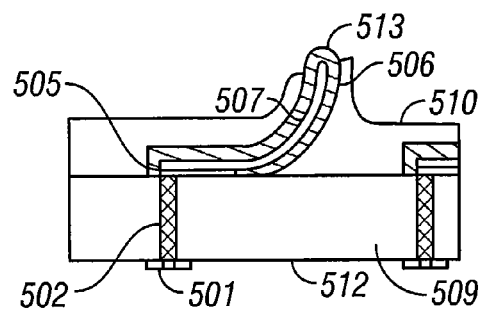
FIG. 6         FIG. 9
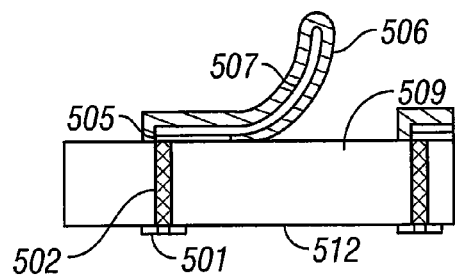
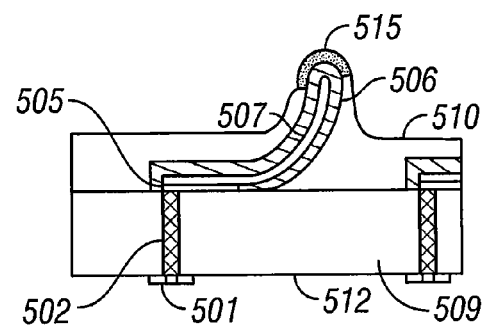
FIG. 7         FIG. 10
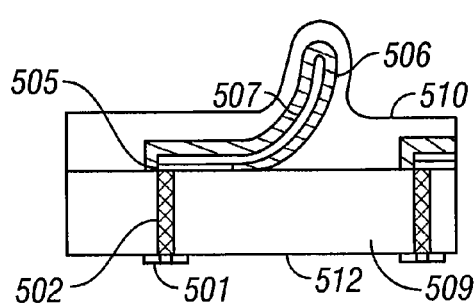
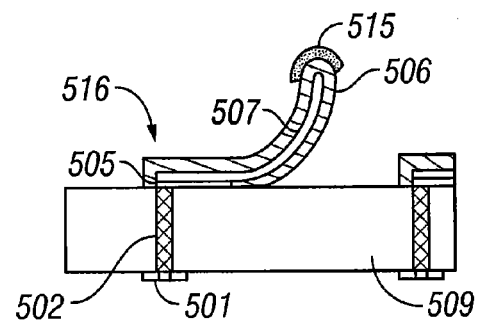
FIG. 8         FIG. 11

MINIATURIZED CONTACT SPRING

CROSS REFERENCE TO RELATED APPLICATION

This application claims benefit of U.S. Provisional Patent Application Ser. No. 60/365,625 filed Mar. 18, 2002, and is related U.S. patent application Ser. No. 09/979,551 filed May 26, 2000; Ser. No. 09/980,040 filed Jul. 28, 2000; Ser. No. 10/094,370 filed Mar. 8, 2002; Ser. No. 10/069,902 filed Nov. 21, 2002 and International Patent Application PCT/US02/26785 filed on Aug. 23, 2002, each of which is incorporated herein in its entirety by this reference thereto.

BACKGROUND OF THE INVENTION

1. Technical Field

This invention relates generally to the highly miniaturized springs. More particularly, this invention relates to a family of miniaturized contact springs and a family of methods for increasing the yield strength and fatigue strength of these springs.

2. Description of the Prior Art

Miniaturized springs have been widely used as electrical contacts to contact pads or I/O terminals on integrated circuits, PCB-s, interposers, space transformers and probe chips for purposes such as testing, burn-in and packaging because even arrays of such miniaturized springs can be fabricated with a pitch of less than 10 µm. A miniaturized stress metal film spring, usually patterned by photolithography, comprises a fixed portion, also called anchor portion, attached to a substrate and a lifted portion, also called free portion, initially attached to the substrate, which upon release extends away from the substrate forming a three dimensional structure as a result of inherent stress gradient in the spring. Typically, the stress gradient in a film is produced through sequential deposition of a plurality of thin film layers by sputtering or electroplating under different process conditions. A typical embodiment of stress metal spring is schematically shown in FIG. 1a, which comprises an anchor portion 101 associated with an electrical contact or terminal 102 attached to a substrate or electrical component 103, and a free portion 104 with a spring tip 105. Examples of such structures are disclosed in U.S. Pat. No. 5,613,861 (Smith) and application PCT/US00/21012 (Chong, Mok).

Other types of springs include discrete springs, fabricated individually or in a group and subsequently mounted on a substrate, such as those used in wafer test or burn-in assembly, or those comprising integrated solid-state devices such as semiconductor devices. Still other types of such springs are those cantilever types of springs, which are fabricated en masse on a substrate using photolithography, as mentioned in the patent literature such as PCT 01/48818, PCT WO97/44676, U.S. Pat. No. 6,184,053, and PCT WO01/09952. Some of these springs are fabricated individually or in a group on a sacrificial substrate and then mounted onto substrates used in the wafer test or burn-in assemblies, or onto those comprising semiconductor devices. FIG. 1b is a schematic cross view of a typical photo-lithographically patterned freestanding cantilever spring fabricated on sacrificial layers, which comprises a base region 201 at one end that is attached to an electrical contact pad 202 of a substrate 203, a contact tip region 204 at the other end of the spring, and the central main body 205 of the spring connecting the base 201 and the contact tip region 204. The problem in this kind of springs is that they are too long. Shorter and smaller springs are desirable for testing and burn-in of some of the current and next generations of integrated circuits, which comprise contact terminal pads with very small pitch, 20–50 µm, for example.

Methods of fabricating shorter springs using photo lithographically processes to add thicker metal coatings have been defined in the patent literature. One method is described in application WO 01/48870. This method uses electroplated photo resist to allow metal to be plated on the top of a free standing spring. However, at the dimensions needed to probe ICs with pad pitches below 150 µm the freestanding springs have insufficient strength to hold back-side photo resist without significantly reducing the probe height required for compliance. Any non-uniformity in the photo process also translates to non-uniform spring heights that cannot meet the uniformity requirements necessary to stay on the IC pads while testing.

The method described in application (WO 01/48870)) also has an additional problem in controlling lift height after plating. One of the purposes of having a freestanding spring is to provide a framework or structure to support the thicker plated metal. If one plates a spring on only one side, the spring curves to a different lift height based on the stress in the plated film. If the film is tensile it curves up and if it is compressive it pushes it down. Both of these stress conditions are difficult to control for the tolerances and spring lift uniformity needed to test ICs. In addition, compressive springs are stronger than tensile springs and the spring with a compressive plated film loses lift height to the point that there is not enough compliance for it to still be a useful probe. There is also a limit to how high a freestanding spring can be lifted prior to plating to compensate for this compression effect. The probe needs to make contact to the IC electrical pad at an angle less than 90 degrees. Increasing the lift height tends to cause the spring to wrap around itself creating a 360 degree circle to the substrate. As a result, the process taught by this patent application does not meet the requirements for controlling uniformity of the lift height of arrays of springs required for IC testing.

One method to build the probe in application WO 01/48870 is to assemble a tip on the plated spring and assemble the spring fabricated on a sacrificial substrate to a second interconnect substrate. The assembly process adds positional placement errors and is more expensive to manufacture than a fully integrated connection button tip as described in the invention herein.

Another method described in patent number U.S. Pat. No. 6,528,350 keeps the photoresist coating, i.e. mask, off the spring, and uses a release layer island to allow plating of the freestanding portion of the spring. For cases where the release mask stops adjacent to the base (anchor portion) of the spring and does not extend along the base of the spring, the thickness and width of the free portion of the spring close to the base become much larger upon plating compared to the base region. As a result, the freestanding portion of the spring is mechanically weaker in the vicinity of the base region. Because the bending moment is the highest in this region, upon application of a force to the spring tip during IC test, the springs fracture early and therefore can not meet the probe lifetime requirement needed in IC manufacturing lines. For the other method described in U.S. Pat. No. 6,528,350, where the photoresist mask does not cover the freestanding portion of the spring as well as part of the anchor portion during plating, there still is a discontinuity in the width which tends to fracture.

The mask alignment and control of spring release process also pose serious problems resulting in uneven plating and a variation in lift uniformity. Another major problem in this process arises from the high resistivity of the relatively thin release layer, as well as the stress metal film, through which the plating current flows. The current density varies widely with the distance from the power connection points at the edge of the substrate. As a result, the plated film characteristics, e.g. microstructure, thickness, stresses etc., vary widely at different areas of the spring. As a result, this process does not produce arrays of springs with reasonably uniform and controlled properties, such as lift height that is essential for effective IC testing.

The invention herein comprises several means to circumvent the problems associated with the above two methods and provides solutions that allow manufacturing of arrays of springs suitable for meeting the stringent requirements of wafer level IC testing. Among other things, the invention allows fabrication of arrays of springs with reasonably uniform lift height and properties, as well as durability. For example, it teaches the practice of enveloping the entire spring core, both freestanding and anchor portions, with electrodeposited films with a balanced stress that allows maintenance of spring heights with appropriate uniformity after electrodeposition. In another teaching, it shows a method to plate the springs selectively without the use of any photoresist mask.

The miniaturized contact springs are subjected to a large number of contact operations during testing which subject the springs to various levels of stresses including cyclic stresses. Also, in packages that use contact springs to join two components, such as chips and chip carriers, the springs are subjected to stresses during testing and operation. The springs are required to withstand such stresses without failure. However, we have observed that the miniaturized springs, such as those with a size of around 400 μm×60 μm×20 μm, start to fail, i.e. being plastically deformed and/or fractured, typically after 10,000 touchdowns, where the contact force exceeds about 1 gf. A major reason of the failure is that the resulting alternating stresses exceed fatigue strength of the spring material. The fatigue strength indicates the alternating stress level at which a material can withstand a specified number of cycles. It is typically some fraction of a material's yield strength, which corresponds to the onset of plastic deformation, i.e. instantaneous permanent deformation. Because a force exceeding about 1 gf is usually required to make good reproducible contacts on aluminum with low contact resistance, as observed in our experiment, the resistance of the springs to failure must therefore be significantly increased to improve the performance and quality of the springs. Springs with larger cross-sections can withstand similar or larger force without failure because the resulting stresses are lower, but they limit the pitch at which springs can be built.

For some operations, such as the burn-in of devices, contact springs are required to make contacts with the device terminals at an elevated temperature, for example around 100 –C. Such contacts may also be required to allow passage of a relatively high current, for example 250–500 mA, during the operation. Under this condition the contact resistance should be quite low, for example 0.1 milli-ohm, so that the contact tip region of the spring may not get damaged by overheating. One way to achieve the low contact resistance is to increase the contact force, by increasing the thickness of the springs. However, a higher contact force increases the stress developed in the body of the spring, particularly near the base region, and thus increases the probability of early spring failure during repeated touchdowns.

Furthermore, the materials from electrical contact pads or terminals tend to adhere to the spring tips during repeated contacts. In cases where the adherence of the pad material to the spring tips increases the contact resistance, or the pad material readily forms tenacious compounds upon exposure to the ambient condition, the electrical contacts are degraded after repeated touchdowns. This also shortens the springs' lifetime. Thus contact tip structure should preferably be comprised of materials that do not have strong adherence to the contact pads or terminals.

Therefore, what is desired is a mechanism for maximizing yield strength and fatigue strength of the miniaturized springs within the miniaturization requirement.

What is further desired is a mechanism to minimize adhesion of the contact pad materials to the spring tips upon repeated contacts without substantially affecting reliability and electrical conductivity of the springs.

A method to fabricate springs with high resistance to compliant stress that results in uniform spring height and provides for a durable tip structure is desired.

SUMMARY OF THE INVENTION

This invention provides a solution to increase the yield strength and fatigue strength of miniaturized contact springs, which can be fabricated in arrays with ultra-small pitches. It also discloses a solution to minimize adhesion of the contact pad materials to the spring tips upon repeated contacts without affecting the reliability of the miniaturized springs. In addition, the invention also presents a solution to fabricate the springs that allow passage of relatively higher current without significantly degrading their lifetime. Also, the invention provides a solution for fabricating robust springs for joining die-bonding terminals to corresponding input-output pads of a substrate comprising an inorganic or organic material for reliable package fabrication. The joining can be facilitated, for example, through the use of solder or conducting adhesives including anisotropically conducting adhesive films.

The stress metal spring according to this invention comprises a multilayer film structure. The thin films have substantially greater yield strength and fatigue strength than the corresponding bulk materials, and thus these springs allow repeated touchdowns during testing or burn-in without any significant plastic deformation, if any.

Deposition of compressively stressed films onto the core films is found useful to increase the spring lifetime. This also allows fabrication of stress metal springs capable of applying large force at the electrical contact pad or terminal.

Thin films are deposited with graded transitions in composition, either continuous or in fine discrete steps, across an interface between two different materials, so that the elastic modulus increases, in general, monotonically with depth from the spring surface to the spring core. The resulting springs exhibit a significant increase in lifetime during repeated touchdowns.

Suitable materials and/or process are found useful to increase the interface robustness in the multilayer structures. Materials of similar lattice parameters are preferably used in the adjacent films and amorphous or nano-crystalline films are used as interfaces. An interface can be made by either "phasing-in" the materials of two adjacent layers or by using an alloy of the materials of two adjacent layers.

The thickness of the free portion of the thin film is preferably within the range of 4–35 μm, which allows reliable and low electrical contact resistance between the spring tips and contact pads or electrical terminals comprised of different materials.

At least one high thermal conductivity film in the multilayer film structure is preferably used for dissipating heat during testing or burning-in at a relatively high current.

Alteration of the process parameters during deposition of the films constituting the spring structure is found useful to enhance spring quality and reliability. For example, thin films comprising the coatings of the spring core are deposited with suitable microstructural features, such as ultra-small grain size, e.g. less than 200 nm, for increasing both the yield and fracture toughness of the spring.

The force used to make good electrical contacts between the springs and the contact pads is substantially reduced. A suitable range of force for contact on aluminum (Al) is 0.8–10.0 gf. For the contact pads made of gold, copper or solder the force to make good electrical contacts is much smaller. The low force photolithographically patterned miniaturized contact springs greatly facilitate the construction of probe card assemblies including probeChips, i.e. substrates with attached probe springs for making contacts with IC terminals, interposers and assembly fixtures for testing and burn-in, as well as packaging, The assembly is greatly simplified by the use of these low force springs, as bending, warping and alignment problems are minimized.

The method to improve the lifetime of the springs includes solutions to minimize surface roughness.

Variation of spring dimensions such as width and thickness is also found useful to improve lifetime. In one embodiment, the free portion of the spring is in a tapered shape.

The invention also provides a less expensive and effective solution to electrodeposit overlying films onto the stress metal springs, circuit traces and electrical contact pads without using any mask.

In one embodiment, the spring tip region, also called a buttoned spring tip, is selectively coated using a lithographic process with a material that minimizes adhesion of the contact pad materials during repeated touchdowns. The thickness of the spring tip region is built up prior to the release of the springs from the substrate.

In another embodiment, a photoresist is applied and patterned to allow selective coating of the tip region, after the spring is lifted and electroplated as required, with a material that minimizes adhesion of the contact pad materials during repeated touchdowns.

The solutions for stress metal springs can be applied to other types of cantilever springs. One embodiment is applicable to other cantilever springs, with or without a buttoned contact structure at the spring contact tip region. Multilayer films are selected and deposited in a sequence following a specific principle that results in the fabrication of robust high performance springs with high durability and increased lifetime. The principle requires that the films are to be selected and sequentially deposited in such a way that the elastic modulus of the outer layers of the springs are lower than that of the interior layers and there is a progressive increase in the elastic modulus from the surface layer to the innermost layer of the springs.

In another embodiment, thin films comprising non-stress metal cantilever springs are deposited with suitable microstructural features, such as ultra-small grain size, e.g. less than 200 nm, for increasing both the yield and fracture toughness of the spring.

In still another embodiment, the non-stress metal cantilever spring layer is comprised of at least one deposited film layer with a built-in compressive stress.

Following the same principles, shorter springs with increased robustness and higher strength can be fabricated.

The invention is applicable to testing and burn-in of various types of solid state devices, such as silicon and III–V devices, display devices, surface acoustic devices, microelectromechanical (MEMS) devices.

In addition, the invention is also applicable to packages in which electrical terminals of electronic components are bonded to corresponding contact pads of an adjacent substrate.

BRIEF DESCRIPTION OF DRAWINGS

FIG. 6 is a schematic diagram of a stress metal film spring formed over a via providing electrical connection to the backside of substrate according to the invention;

FIG. 7 is a schematic diagram of a stress metal film spring formed and subsequently plated to improve robustness according to the invention;

FIG. 8 is a schematic drawing of a plated stress metal film spring coated by photoresist according to the invention;

FIG. 9 is a schematic drawing of a plated stress metal spring coated by patterned photoresist, exposing the spring tip according to the invention;

FIG. 10 is a schematic drawing of a plated stress metal spring with contact tip material plated on the exposed portion of the tip according to the invention;

FIG. 11 is a schematic drawing of a plated stress metal spring with contact tip material after removal of photoresist according to the invention;

DETAILED DESCRIPTION OF THE INVENTION

Miniaturized springs can be fabricated using thin film or discrete component fabrication technologies such as wire bonding. In general, for springs to perform satisfactorily in wide range of applications, the yield strength of the materials is required to be higher than the stresses applied to the springs during testing or burn-in, or in assembled packages. We have observed that many thin film stress metal springs are plastically deformed during testing because the spring material's yield strength is lower than the applied stress. A stress metal film typically comprises a strong core film composed of materials, such as molybdenum (Mo) or its alloys, tungsten (W) or its alloys, with additional overlying film coatings, such as nickel or nickel-cobalt (Ni—Co) alloy films. Some of these films are relatively thick, typically $4\times10^3$ to $10^4$ nm in thickness, which is required in order to increase the force that needs to be applied by the spring to the contacting surface for establishing good electrical contact. High yield strength of such films is required for ensuring satisfactory performance of the springs.

Because the stress metal springs produced by this invention are batch fabricated, using thin film/IC or MEMS technology, on substrates or electrical components, the springs described herein are particularly suitable for testing, burning-in and packaging (including 3-dimensional packaging and chip to chip-carrier bonding) applications involving probe cards, interposers, space transformers, PCB-s, wafers, electronic components and microchips with highly miniaturized contact pads or I/O terminals with a pitch ranging 3–100 μm. The existing technologies are mostly not suitable for such applications. The dimensions of the corresponding springs or spring terminals are also very small, typically ranging from 10 to 1,000 μm in length, 3 to 500 μm in width, and 0.1 to 40 μm in thickness. The curl radius of the lifted core is typically 20–2,000 μm. Note that the teachings of this invention can be used also to produce springs or spring terminals outside of the dimensional and pitch ranges indicated. Also note that the teachings of this invention can be applied to both the stress metal springs and any other miniaturized springs comprising thin films.

Figure 1A:
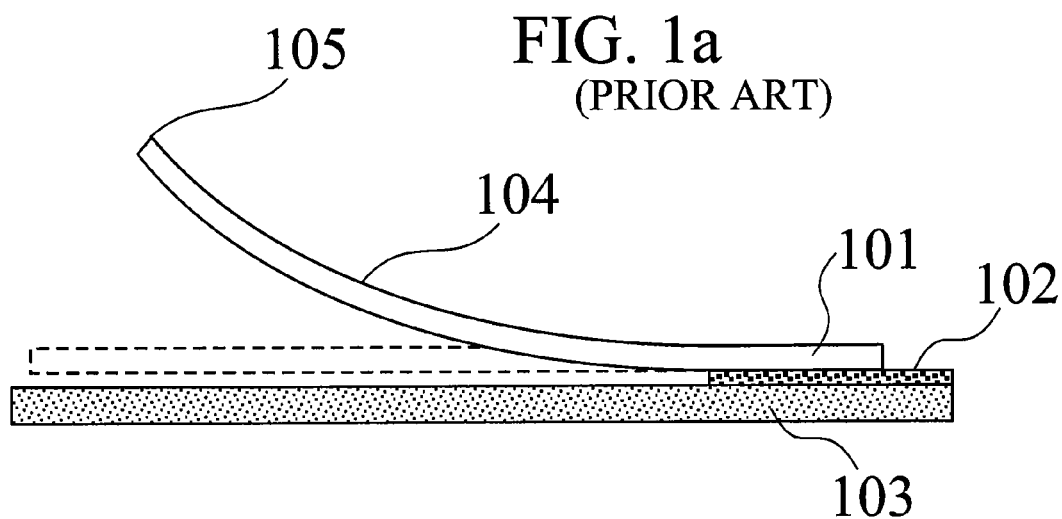
FIG. 1a is a schematic diagram illustrating a typical stress metal film spring according to the prior art.
Figure 1B:
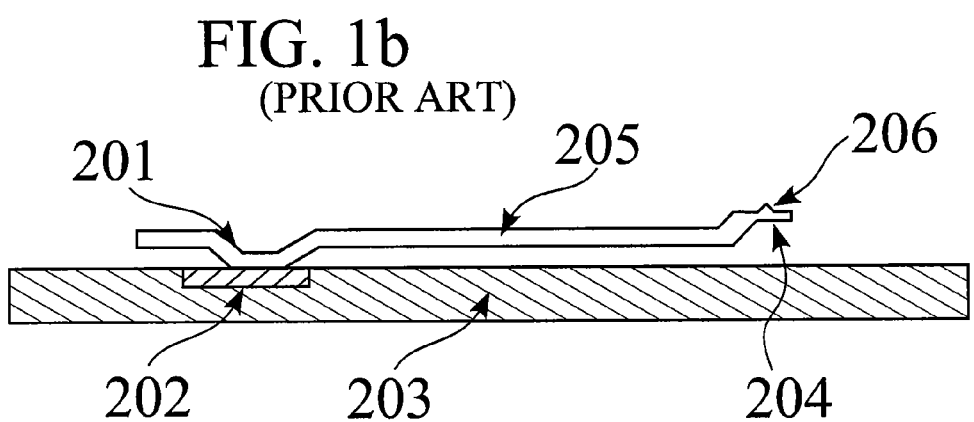
FIG. 1b is a schematic diagram illustrating a typical cantilever spring according to the prior art.
Figure 2:
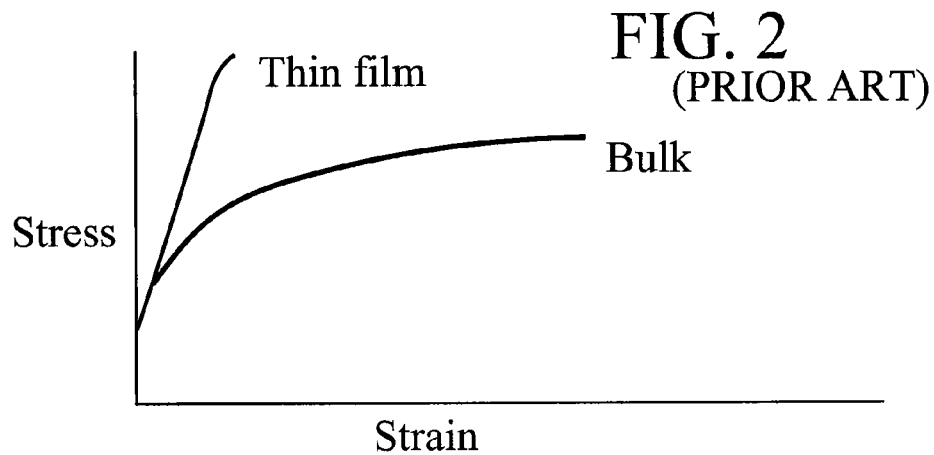
FIG. 2 is a diagram illustrating the stress-strain curves of thin films v. corresponding bulk materials.

In one preferred embodiment of this invention, multiple layers of very thin films, each with a thickness less than about 1.5 to 2 μm, are used to fabricate the springs to increase the yield strength of thin film spring materials. This is particularly useful for building up the coating layers over the thin film spring core. The stress-strain curves of thin films, shown schematically in FIG. 2, are very different from those of the corresponding bulk materials. The materials in thin films exhibit much higher yield strength, i.e. the films maintain their elasticity at a higher stress, and relatively smaller plastic deformation before failure, as compared to the same materials in bulk form. In general, the thin film yield strength is much closer to the theoretical strength of the material than the corresponding bulk material yield strength. As the film thickness increases, when greater than about 2 μm, for example, the films increasingly exhibit bulk stress-strain characteristics. As a result, the elastic limit of thicker films is lower than that of thinner films. In addition, the grain size of very thin films is generally much smaller than the relatively thick films, which also results in an increase in both yield and fracture strengths. Thus, the springs with thinner films are more robust.

Figure 3A:
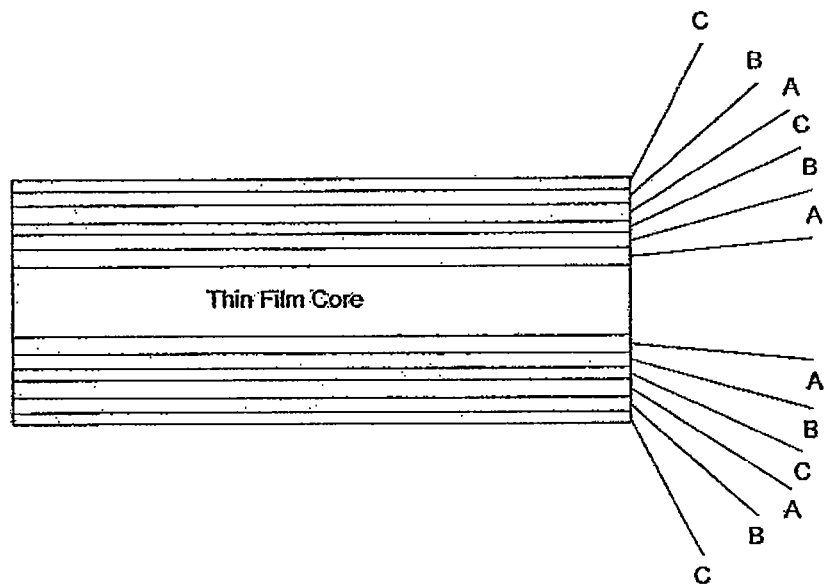
FIG. 3a and FIG. 3b are schematic diagrams illustrating a stress metal film spring with a multilayer structure according to the invention.
Figure 3B:
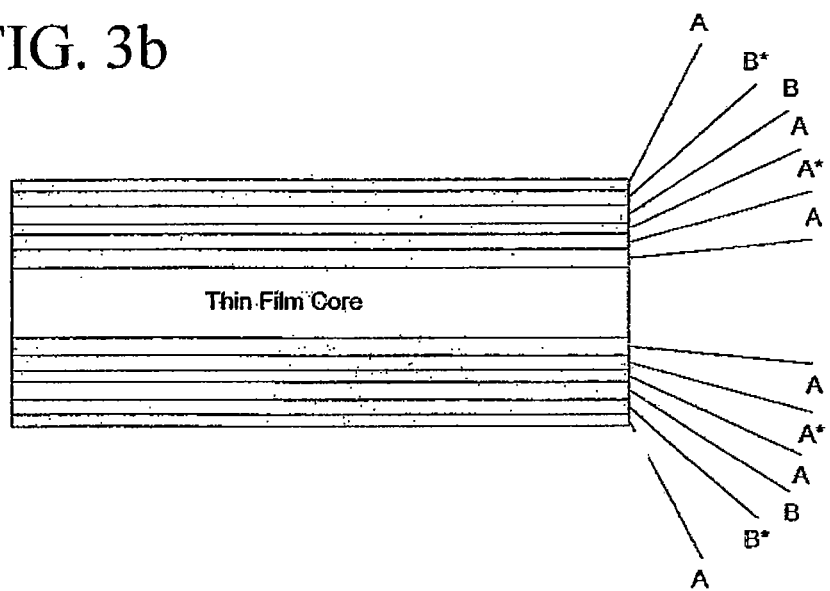

In this preferred embodiment a discontinuity in the atomic arrangement is deliberately introduced at the interface between two adjacent films so that the two films retain their individual mechanical characteristics and the interface impedes defect propagation from one film to the other. Altering the deposition parameters after a film is deposited to the required thickness is one way of achieving this. Another way to engineer this interface is to sequentially deposit two different materials next to each other. This includes use of two different materials, e.g. Cu and Ni with close lattice parameters in two adjacent layers for enhancing the bonding at the interface. Note that this scheme also works if the lattice parameters of the two adjacent layers are not very close to each other. Using such a scheme, multiple layers of thin films can be deposited to build up the desired spring film thickness. The top layer of the spring is preferably a thin film structure that resists environmental degradation during storage or operation and adhesion of the contacting material to the spring surface. The embodiment is schematically shown in FIGS. 3a and 3b, wherein A, B, C etc. indicate different materials. In illustrating a deposition of the same material but using different process parameters to form the next adjacent layer, an asterisk is used to indicate the adjacent layer, e.g. A and A*.

The multilayer springs formed in this manner can be annealed at a relatively low temperature, if desired, for a short time, e.g. 150–C. for 10 min to facilitate bonding between adjacent layers and relaxation of the internal stresses in the films to impart additional robustness in the spring.

In a variation of this embodiment, the deposition condition may be altered to produce a non-crystalline or crystalline thin film, less than about 200 nm, in between two relatively thicker, approximately $\leq 2000$ nm, film layers in order to facilitate bonding between adjacent layers. Examples of such in-between material films are Au, Ag, Ni, Cu and etc.

Various deposition techniques can be used to deposit the multilayer films, such as physical vapor deposition (for example, sputtering or CVD), electro-deposition and chemical vapor deposition. In a particular embodiment of the spring that is suitable for making good electrical contacts with contact pads or terminals of various materials, the spring is comprised of a sputter deposited core of about 1–4 μm thick Mo—Cr films with a stress gradient across the thickness (compressive bottom to tensile top). The multilayer thin films, e.g. Ni or its alloy overlying the core are deposited on all sides of the core, after the free portion of the spring is released, using film deposition techniques such as electroplating techniques (dc and/or pulse deposition), to an overall spring thickness of about 18–35 μm. The electrodeposition technique, both electroplating and electroless, is a preferable technique, for coating the core film. Pulse plating, a method for electrodeposition, is particularly useful for the coating, as it tends to produce denser films. Composition modulated electrodeposition techniques can also be used to deposit the multilayer films.

We have discovered that for stress metal springs, whether comprised of multilayer of very thin (less than about 2 μm thick) films or relatively thicker, e.g. greater than about 2 μm films, with a thickness of 1–45 μm for the free portion, are quite suitable for making good electrical contacts with various materials comprising electrical contact pads or electrical terminals on different substrates or electrical components. A preferable thickness range for fabricating the free portion of the springs is 4–35 μm. Excellent electrical contacts (very low contact resistance) have been obtained between tips at the end of the free portions of these springs, with an appropriate thickness in this preferable range, and electrical contact pads or terminals, which contain mainly gold (Au), copper (Cu) or commonly used lead-free or lead-bearing solders or aluminum (Al).

In another equally preferred embodiment, the failure resistance of the springs, comprised of different films with relatively thin, e.g. 0.2 μm or thick films, e.g. 10–15 μm, is substantially increased by electrodepositing, e.g. by electroplating the films onto the core film in such a way that all or at least the relatively thick overlying films, specially those near the spring surfaces, remain under a compressive stress. This means that the completed spring is designed to be pre-stressed. In order to maintain the pre-stressed condition, both the overlying and core material should have high elastic limit that resists plastic deformation. In addition, the interface between different film layers should also be strong. In a typical embodiment, the overlying film with compressive stress is comprised of nickel, with a thickness of about 10 μm on each side of a Mo—Cr core film. Use of appropriate deposition conditions, e.g. additive concentrations in the electrodeposition bath, produces such a film. The resulting spring withstood many touchdowns without any failure. One of the reasons for spring failure is the development of high tensile stress in the spring surface as it is pressed to make contacts with electrical contact pads or terminals. The fatigue strength of materials is, in general, lower under tensile mean stress than under compressive mean stress. The described solution minimizes the development of tensile stress in spring surfaces when pressed into contact with contact pads or terminals, and thus increases the resistance of the spring to failure. This scheme, and those to be described in the following paragraph, also allow fabrication and use of thin stress metal film springs with relatively large overall thickness that is useful for generating high contact force needed at the electrical contact pad or terminal for some applications.

Note that the completed spring is designed to be pre-stressed. Pre-stressing is preferably achieved by compressive stress. However, the range can be low tensile stress to compressive stress, e.g. tensile 30 MPa to compressive 70 MPa. Stresses are different for different thickness of the Ni plating for the same additive concentration. For thinner films the stress is higher. For example, for 1.5 μm thick film the stress is about 70 MPa compressive. The range of compressive stress that can be produced in plated Ni springs with the same additive concentration is about 6–70 MPa (compressive) for thicknesses ranging from 25–1.5 μm. Thus the stresses for various Ni film thicknesses can be tailored through variation of additive concentration.

Another effect of change in additive concentration in the plating solution is reflected on the grain size of the plated films. For the currently plated springs with increased additive concentration, the grain size was found to be one-fifth (20%) of the samples plated earlier with smaller additive concentration. The smaller grain size increases the yield stress of thin films ($d^{-1/2}$ dependence). This is an important contributing factor in increasing the lifetime of our springs during repeated touchdowns. A preferred range of grain diameter in the film, e.g. Ni that overlies the spring core is 3–500 nm, and a typical preferred value is 50 nm. The plated overlying films seem to be stronger as the grains become more equiaxed, e.g. ratio of larger to smaller dimension of grains is less than 2.

In another equally preferred embodiment, selection of film materials for deposition of a multilayer stack of films, whether comprised of relatively thick, e.g. thicker than about 1.5–2 μm, or very thin (less than about 1.5–2 μm) films, is made in such a way that films with lower elastic modulus are deposited near the spring surface, and films with increasingly higher modulus are deposited towards the core. In a variation of this embodiment, films are selected and deposited over the core in such a way that it results in a reasonably continuous increase of the elastic modulus from the spring surface to the spring core, namely in graded deposition in compositions. Graded transition in compositions and elastic modulus from the spring surface to the core, either continuous, or in fine discrete steps, across an interface between two different materials can be used to distribute the stresses at critical locations, and thus suppress the onset of permanent damage. In these configurations, as the springs are pressured to make electrical contacts with contact pads or terminals, the critical tensile stresses, which results in the nucleation of damage at the surface, are lowered at the surface as the higher modulus beneath the surface spread the stresses from the surface to the interior of the spring. This reduces the probability of crack initiation at the spring surface during repeated touchdowns, and thus the spring lifetime is increased. As examples of this embodiment, the spring surface layers (i.e. outer surfaces of the overlayer stack) consists of palladium alloys (such as those comprising Ni, Co, or Pt), gold alloys (such as those comprising Ni or Co), Pt alloys etc.; whereas the film layers closer to the spring core, e.g. Mo—Cr, are comprised of nickel or Ni alloys, e.g. Ni—Co. The higher the concentration of Pd or Au in nickel is, the smaller is the elastic modulus. Thus, in another illustration, the spring lifetime is increased by depositing nickel or its alloy with higher elastic constant onto the core film, e.g. Mo—Cr followed by deposition of successive layers of overlying films that contain Ni with increasing amount of Pd. The outer films in this case contain relatively high concentration of Pd, e.g. 10–50 w% Ni and 90–50% Pd. For graded films, as mentioned above, the Pd concentration in Ni is changed continuously from the core to the surface. The latter can be achieved through variation of deposition parameters of conventional deposition technique, e.g. electrodeposition, during the deposition process. The core material can be a material with higher elastic modulus than that of other films.

Various material combinations can be used to fabricate the multilayer film stack over the stress metal spring core. These are applicable to both very thin (less than 2 μm) and relatively thick, e.g. 2–20 μm, individual constituent films. Such combinations are selected from groups of materials including Ni, Au, Ag, Cu, Co, Rh, Ru, Pt, Os, Pd, TiN, W or their alloys, such as Ni—Co, Pd—Ni, Pd—Co, Co—Pt, Au—Pt, Pd—Rh, Ni—P, Ni—Mo, Ni—Co—Pd, Ni—Mo—W, Ni—P—W and etc. Solid solutions comprising at least two materials, such as Ni with less than about 12% W, or Ni with 2% Mo, or Cu—Rh—Pd or Pd—Ni or Pd—Co, Ni—Co or Co—Pt and etc. are particularly good candidates to fabricate the multilayer within film stack, as they enhance the mechanical properties of the film.

Multilayer films are particularly suitable for making electrical contacts with terminal/contact pads during testing and burn-in process that requires passage of a relatively high current. A common practice in the industry is to make occasional probe contacts to terminal pads at a current level of 250–500 mA. This often leads to contact failure because of excessive heat generated at the contact region. Modeling of heat flow has shown that the highest temperature is reached near the spring tip region. Melting of the spring tip regions has also been observed in some cases. It is shown in this invention that addition of a good heat conducting film, such as Cu with a typical thickness of about 0.75–2 μm, in the multilevel stack of films of which the spring is comprised, can overcome the problem. Presence of Cu allows the heat to be dissipated quickly from the tip region and thereby minimize the damage during testing or burn-in. Of course, different thicknesses, e.g. greater than 2 μm, of the good heat conducting films will also work for this purpose.

Figure 4:
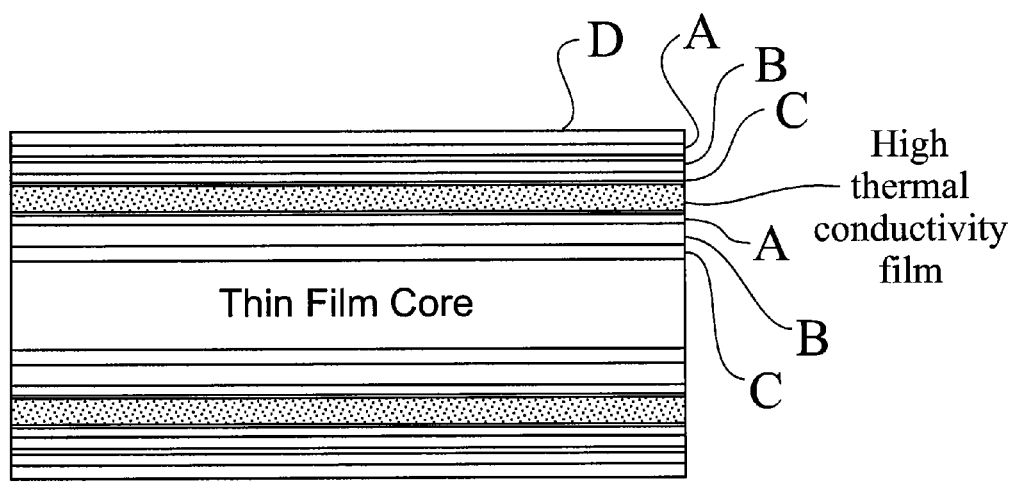
FIG. 4 is a schematic diagram showing a stress metal film spring with a multilayer structure comprising at least one high thermal conductivity film according to one embodiment of the invention.

FIG. 4 is a schematic diagram showing such a spring finger that includes a Cu film for improved thermal conductivity. Other high thermal conductivity materials can also be used instead, or in addition to Cu, for improving the heat dissipation from the spring tip. Examples are: Au, Ag, Al etc. In this solution, the films with high thermal conductivity can be deposited before or after the spring is lifted. If the film is electrodeposited after the lifting, the high conductivity film can be deposited all around the core film. If the film is to be deposited on one side of the spring, or only at and near the tip region, the deposition can be done before the spring is lifted and patterned.

The build up of high temperature near the spring tip region is minimized if the probe-tip to contact pad electrical contact resistance is minimized. The reduction of the contact resistance can be achieved by increasing the force applied by the probe-tip onto the contact pad also. We have found that the electrical contact resistance between the spring tip and contact pad or terminal is less than $1\pi$ when the contact is reliable and stable. A preferable range of values for good electrical contact and good heat dissipation is about $\leq 0.1$–$0.2$ Ohm.

In another embodiment of the invention, the thin film springs can be strengthened against failure by strengthening the interfaces between different film layers against defect propagation and by enhancing good bonding between two adjacent film layers. For example, the interface between the core spring material Mo—Cr and an adjacent layer of Ni film can be significantly strengthened, and bonding between the two layers at the interface be made substantially stronger, by phasing-in Ni at the end of Mo—Cr deposition. The phasing-in can be achieved as follows. Shortly before the end of Mo—Cr deposition, Ni deposition is initiated. Then the Mo—Cr deposition rate is gradually brought to zero, while adjusting the deposition parameters appropriately increases Ni deposition rate. For subsequent Ni or its alloy deposition on the core by other methods, such as eletrodeposition, Ni or its alloy is deposited on the Ni surface of the core. As a result a robust bond formation occurs and the interface strength is enhanced. Such interface engineering can also be applied to enhance the interface quality between two adjacent electrodeposited film layers. In that case, near the end of deposition of an electrodeposited film A, which is to be followed by deposition of another electrodeposited film B, an alloy of $A_x B_{1-x}$ can be deposited using suitable process parameters.

In another embodiment of this invention involving electrodeposition to deposit thin film coating layers on the spring core, the deposition parameters are changed intermittently during deposition in order to improve the quality of the coating films. It is known that electrodeposition of relatively thick films of a material often shows increased porosity in the film layers near the top of the film typically at a thickness exceeding about 1.5–2 µm. Consequently, changing the film parameters, e.g. dc plating to pulse plating or changing the current density during deposition, improves the quality of the film significantly. As a result, the film becomes stronger and resists early failure during testing or operation. Variation of deposition parameters during electrodeposition can change the microstructures, e.g. grain size, and crystallographic structures of the deposits, as well as film stresses.

Figure 5:
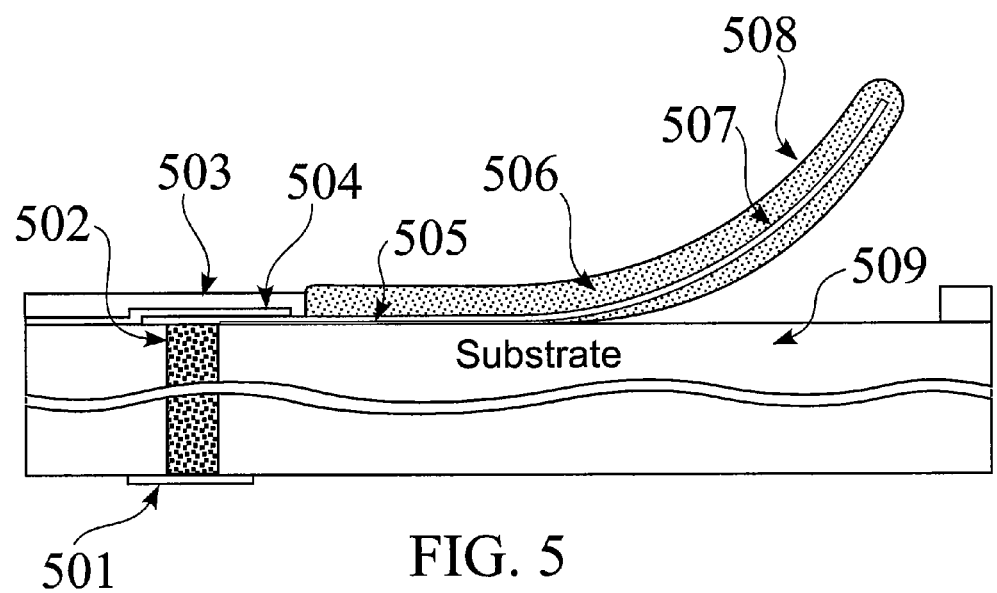
FIG. 5 is a schematic diagram illustrating a solution for spring design and fabrication where a metal filled via, an insulated polymer film and an electrical trace are used according to one embodiment of the invention.

FIG. 5 is a schematic diagram illustrating a solution for stress metal spring design and fabrication according to another aspect of the invention, wherein 501 refers to an electrical pad, 502 to a metal filled via, 503 to an insulator film, such as a polymer film, 504 to an electrical trace, 505 to a release layer, 506 a plated film, 507 a spring core, 508 to a plated film at surface, and 509 to a substrate. This design allows establishment of good electrical contacts at reduced force and thus results in a substantial increase in the resistance to failure during repeated touchdowns. The fatigue life of a structure is a strong function of the applied stress. Thus, achieving low stable contact resistance at a low contact force, enabling lower stresses in smaller size structures, is highly desirable for increasing the spring lifetime and performance. Some miniaturized springs fabricated in a different way from this invention, which are also used for testing or burning-in of electronic components, reportedly require a contact force ranging from 2–150 gf. In several experiments, we have demonstrated that the stress metal springs with the basic structure according to this invention as shown in FIG. 5 can make a very good contact at a far smaller force. In these experiments, some of the films, e.g. Ni or Ni alloy, overlying the core film on all sides were not very thin, e.g. thicker than 2 µm, and the outer surfaces of the spring are coated with a relatively hard, environmentally stable material, such as Pd—Co or Rh. However, a force as little as 1.4 gf at the contact between these springs and Al, one of the most difficult materials to make electrical contact with, resulted in a good, low and stable contact resistance. In fact, we have found that the force should preferably be maintained within a range of about 0.8 to 10.0 gf for effective electrical contact between these springs and Al. A higher force tends to damage the contact pads 501, and a lower force fails to penetrate the surface oxide reproducibly. For contacting other materials, such as Au, Cu, and solders, which do not form tenacious oxide like that on Al, the force required to make good electrical contacts is significantly smaller, for example 0.2 gf. We have obtained good electrical contact between our probe springs and gold contact pads at a force as low as 0.01 gf. As mentioned above, establishment of a good electrical contact with low contact resistance also allows testing of circuits or devices at a higher current without encountering significant degradation of spring quality due to high heat problem. Consequently, the probe springs with the structure shown in FIG. 5 are desirable for tests or burn-in requiring passage of higher current. Similar springs with multilayer structure comprised of very thin films, less than about 2 µm for example, are also suitable for such tests or burn-in that require passage of higher current.

Capability to make good electrical contacts between the springs and the contact pads or terminals at a very low force, as indicated above, results in a number of benefits. The introduction of copper metallization and low dielectric constant materials in deep submicron integrated circuits by the microelectronic industry has opened up substantial demand for low force probe contacts during testing and burn-in of the chips. The low k dielectric materials are relatively fragile. Consequently the spring structures described here are particularly suitable for applications to circuits comprising Cu films and low dielectric constant materials. These springs can make good electrical contact on Cu with a relatively low force, for example, less than 1 gf. So chances of damaging the circuit elements are minimized.

Another important benefit from low force contacts is related to the fabrication of interposers. As is known in the art, probe card assemblies often use interposers in between the ProbeChip (or space transformer) and load-board (PCB that is connected with the tester) to establish electrical connection between the IC to be tested and the tester. Cantilever type of springs is attached to these interposers for facilitating electrical connection. For currently available probe card assemblies in the market, the force applied by each of these interposer springs is relatively high, e.g. 15–30 gf. Interposers having miniaturized stress metal springs fabricated by the present invention can make electrical contacts with opposing contact terminals at a far lower force, e.g. 0.005–2 gf, because the contact terminals are generally comprised of materials other than aluminum, e.g. gold. Such a small contact force can be applied by these springs consisting of only the core material, e.g MoCr, without any plating. Of course, relatively thin layers of plating are preferred, e.g. with gold, in some applications for increasing electrical conductivity of the springs or the mechanical properties, e.g. wear resistance of the spring tips. As a result of the low force contact springs, the total force applied by the interposers having thousands of springs is vastly reduced. Thus, use of the present photolithographically patterned miniaturized stress metal springs for the construction of probe card assemblies including probeChips, interposers and assembly fixtures for testing and burn-in, as well as packaging, are greatly simplified by the use of these low force springs, as bending, warping and alignment problems are minimized. Because of the low force exerted by the springs of the present invention on the contact to establish good electrical connection, bulky mechanical supports for assembly, and even the interposer, can be dispensed with for many applications. Thus, the use of the low force springs, described herein, results in a significant increase in yield and reliability, as well as reduction of cost and complexity.

It is known that increasing the thickness of the spring can increase the spring contact force on contact pads or electrical terminals. Mathematical expressions are available to calculate the force as a function of spring dimensions. In stress metal springs, the core material, e.g. Mo—Cr, thickness is kept typically less than about 5–6 µm to facilitate lifting of the free portion of the spring following its patterning on the substrate. Films are subsequently deposited onto the spring, e.g. by electrodeposition, to increase its thickness for applications requiring increased contact force. Deposition of additional films selectively onto the spring using photolithography or other methods is quite complex and costly due to the non-planar structure of the springs. In this invention, a much simpler and effective solution has been applied to deposit different films by electrodeposition onto the spring, as well as on the circuit traces, if needed. This solution does not require the use of any masking. In this case the electrical contact to the arrays of springs is made from the backside of the substrate 509 by blanket deposition of an electrically conducting thin film onto it or backside patterning the film to give better current density control. The electrical continuity is established using a via, such as 502, through the substrate, which are filled with electrically conducting materials that are in electrical contact with the springs, adhesion layer 505, spring metal 507, traces, e.g. 504, or contact pads, e.g. 501. Consequently, films are deposited only onto the electrically conducting surfaces that are electrically connected to the appropriate terminals of the power supply at the back of the substrate. This scheme allows selective electroplating on all surfaces on the lifted spring thus enveloping the spring and also electroplating, traces, and other metal structures that are not covered with an insulating material. Preferred substrates comprise inorganic materials such as ceramic, quartz, silicon, glass. Other substrates comprising organic materials, such as polymer, epoxy, FR4 and polyimide can also be used within the scope of this invention. An example of the latter group of substrates are printed circuit boards using FR4, Dupont's Thermount and Nelco's N4000.

Previous work (WO 01/48870) also reported plating of materials onto lifted stress metal springs. However, due to the non-planar structure, they used complicated photoresist patterning to electroplate materials on one surface of the lifted springs. In our work we have found that that method does not work well at all for a manufacturing process, as the presence of stresses in the electrodeposited films primarily on one surface of the core spring material affects the spring lift height. In addition, the photoresist deposited onto the free portion and the base of the spring tends to pull the lifted portion towards the base uncontrollably, apparently due to surface tension effect, because the spring core is made very thin to allow appropriate lifting. As a result, this method is not suitable for obtaining reproducible and controlled lift height for arrays of springs. In the present invention, this problem is eliminated by electrodepositing an envelope of material over the spring core without the use of any photoresist mask as illustrated in FIG. 5. The stresses on the two sides of the core spring are also reasonably balanced in this case, thereby minimizing the alteration in the spring lift height due to plating. Maskless plating of the spring cores is thus very desirable for producing an envelope of electroplated films covering all core surfaces (and also other electrically conducting surfaces around the springs, if desired) using substrate through-vias to establish electrical contacts from the substrate-surface opposite to the surface where the springs are located.

FIG. 6 shows the lifted spring prior to plating and FIG. 7 shows the spring after plating. To maintain the appropriate stress of the plated film it is important to compensate for changes that occur in current density as the area of the lifted springs changes. Current supplies must be programmed to manage stress in the film as to compensate for changes in the spring thickness which reduce current density.

A problem often encountered upon a large number of touchdowns e.g. 100,000, is the build up of contact pad materials on the stress metal spring tip regions. This affects the contact resistance and the lifetime of the spring, particularly if the contacting pads are comprised of aluminum. Coating the probe tip region with a metal or an electrically conducting material to which the contacting metal e.g. Al) does not adhere to well or at all minimizes this problem. Examples of such coating materials are platinum group materials including rhodium (Rh), palladium and ruthenium and their alloys comprising two or more additions, e.g. palladium-nickel, palladium-rhodium, palladium-cobalt, palladium-gold-rhodium as well as titanium nitride, Ir—Au, Ir—Pt, gold-cobalt, zirconium nitride etc. Although thin films of such coating materials are deposited onto the body of the probe springs for low force and lower current applications, after stress metal springs are released from the substrate, it is desirable to deposit the coating only near the spring tip region for some applications. One reason for not depositing a coating material all over the main body of the spring is to have flexibility in choosing the coating material, for example, for the desired elastic modulus, and the film thickness, for selectively coating the spring tip region. Presence of some coating materials with a relatively large thickness on the main body of the spring can affect the reliability of the springs. This invention provides a new solution to deposit such a coating very controllably on only the tip region of stress metal springs using a technique that is compatible with the integrated circuit technology. In this solution, a "button" comprised preferably of a plurality of electrically conducting films is fabricated at the spring tip region for making contacts with the electrical contact pads or terminals. In one embodiment of this solution, the coating material, as mentioned above, is deposited as the final overlayer onto the "button" before the free portion of the probe spring is released from the substrate. As a result, the problem associated with subsequent lifting of the free portion of the spring to the appropriate height is minimized, because only a small portion of the spring is constrained by the tip coating material, while the rest is free to bend and lift. This approach is used for lower force springs that do not require additional thickness for higher force or improved spring conductivity (MoCr springs are thin and resistive).

The process steps for fabricating springs with "buttoned" tips, as mentioned above, are as follows. Following the deposition of the stress metal spring core film, e.g. Mo—Cr, a mask, e.g. photoresist, is deposited onto the core film and patterned using techniques, e.g. photolithography, to define a spring. The spring is etched, the photoresist removed, and an additional photo process is followed, such that all of the core film, except the spring tip regions, remains covered with the mask. Subsequently the film, e.g. Rh, that is to be later deposited as overlayers onto the core of the spring is deposited to the desired thickness onto the exposed spring tip regions followed by deposition of appropriately thick, e.g. 1–4 µm, final overlayer comprising the coating material mentioned above, e.g. Pd—Ni, Pd—Rh, Pd—Co, Rh or TiN. The coating layer thickness range could be of course be higher also, e.g. 1 to 20 µm, for this invention to work. Note that In a variation of this embodiment, films to be deposited onto the spring tip region can also be comprised of materials other than the one that is to be later deposited onto the main body of the spring. Upon removal of the mask, etching is used to undercut the spring and release the free portion of the spring from the substrate. This is followed by deposition of overlying films to the desired thickness onto the main body of the springs, while the spring tip regions already fabricated is kept protected with a mask of, for example, photoresist or polyimide.

The thickness of the resulting tip region could be designed to be approximately equal to the remaining part of the lifted springs. Subsequently the mask is removed and the probe springs with the desired thickness of the coating materials on the spring tip regions are obtained. Although a number of film deposition techniques can be used to deposit the overlayers and the final coating layers, electrodeposition is a preferred for such depositions. In another variation of this embodiment, selective deposition of overlying films onto the spring tip regions prior to spring release can also be done after patterning the deposited core film into spring fingers, instead of patterning the spring fingers after the coating films are deposited onto the spring tip regions. The rest of the subsequent process steps are the same for both embodiments.

The preferred method for fabricating buttons on raised plated springs like the one shown in FIG. 7 is described below. The spring tip region is selectively coated (button fabrication) with one or more suitable materials, after the spring is lifted from the substrate, using photolithography. In this method, a photoresist is deposited using well-known techniques, such as spinning or spraying or plating, onto the lifted springs. The preferred method is to spin on photo resist. Unlike non-plated springs, thick photo resist can be applied to the springs because the relatively thick envelope of material over the core stiffens them substantially. Because of this enhanced stiffness the spring height is not affected significantly by the application of photo resist. The spring covered in photo resist is shown in FIG. 8. For plating of the photoresist, the electrical terminals at the back side of the substrate is used for connection to the power supply, as discussed above. The backside terminals are connected to the springs on the front side of the substrate through metallized vias. The photoresist is then selectively removed from the spring tip regions, including the top surface and the sidewalls of the tip regions, using photomask and photolithography techniques as shown in FIG. 9. Subsequently the tip coating material, as described in the preceding paragraph, e.g. Pd—Ni, Pd—Co, is deposited onto the spring tip regions using conventional techniques, preferably electroplating. Sputtering or CVD can also be used in which case, coating materials are also deposited onto the photoresist layer, which are subsequently removed along with any unwanted overlying coating materials using conventional solvents, leaving the coating material on the tip regions only. Electroplating of the spring tip regions not covered with photoresist allows substantial coverage of the tip region. The preferred materials for buttons are comprised of platinum group materials (namely Pd, Pt, Rh, Os, Ru and Ir), Ni, Co, Au and Ag. This structure is shown in FIG. 10.

In the process described in the preceding paragraph, the tip buttons are plated following the deposition of the relatively thick envelop of a material e.g. Ni) onto the core, which stiffens the spring substantially. Because of this enhanced stiffness and the relatively small area coverage of the spring by the button, spring lift height is not affected significantly by button plating.

After the Button tips have been plated, the photo resist is removed leaving the final structure as shown in FIG. 11. Note the anchor portion 516.

In case metallized through vias are not present in the substrate for enabling backside connection, a variation of the solution described in the preceding paragraph can also be used to selectively apply coating to the spring tip region following the lifting of the spring core film and deposition of the overlying films. In this case, an electrically conducting material, such as Au, Ag or Cu, is first blanket deposited, using a technique such as sputtering or electrodeposition or CVD, all over the substrate containing the stress metal springs after the lifted spring is fabricated to the desired thickness including the overlying films over the core films. This conducting layer is used for providing electrical connection for button electroplating of the spring tips. Then photoresist is deposited all over the electrically conductive surfaces. Using photolithography techniques, as described in the preceding paragraph, the coating material is selectively deposited onto the spring tip regions only. The thin conducting material deposited prior to the photoresist deposition is then removed by wet or dry etching techniques.

Figure 12A:
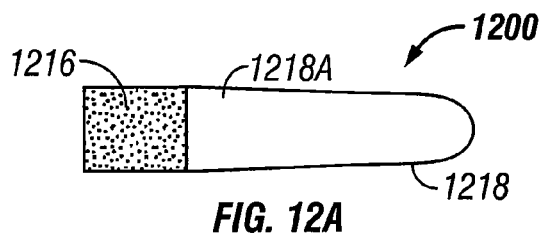
FIG. 12a is a schematic diagram showing a stress metal film spring with varying width in tapered shape according to one embodiment of the invention.
Figure 12B:
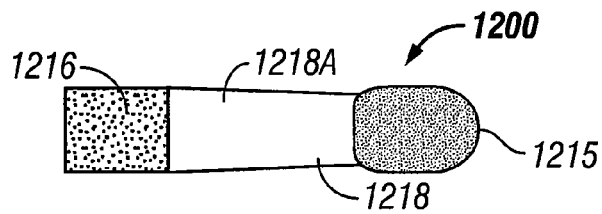
FIG. 12b is a schematic diagram showing a stress metal film spring in tapered shape wherein the tip area is coated with a contact material according to one embodiment of the invention.

FIG. 12b illustrates a particular embodiment of the selectively coated spring tip region with an improved spring lifetime, wherein 1215 refers to a tip button with protective coating, such as Pd—Co or Pd—Ni alloy, etc. Here the free portion 1218 of the spring is substantially tapered. As discussed later, for this embodiment, the spring lifetime is substantially enhanced, and the coating material at the tip region does not show any significant degradation, during repeated touchdowns.

Figure 13:
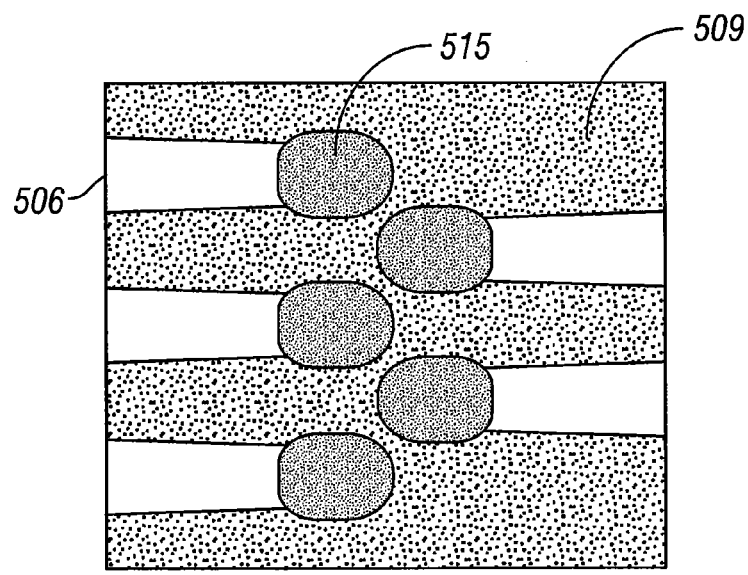
FIG. 13 is a schematic drawing of plated stress metal springs with contact tip material in an interleaved array according to the invention.

FIG. 13 is a drawing showing the result of tip (button) plating using photoresist application followed by patterning to expose the tip region and selective coating of the tip region by electroplating of a Pd—Co alloy. All the tips can be substantially covered with the plated buttons, although generally only a relatively small area of the spring tip contacts the IC terminals or electrical contact pads on other components of probe card test assemblies for electrical testing or burn-in operations. The large area coverage of the spring tips by the button materials provides flexibility in designing the springs and test assembly. In addition, joining of the springs to IC terminals or contact pads of electrical components for packaging applications using techniques such as soldering is greatly facilitated through the use of buttons that substantially covers the spring tips. In such cases, button plating materials are selected from the group that form good reliable bond with the solder e.g. Sn containing alloys, Pb—Sn or Pb-free solders) commonly used in microelectronic packaging industry. Examples of button materials or spring coating materials for making contacts with solders or conductive adhesives in packaging applications are multillayer stack of films comprising platinum group materials, e.g. palladium, platinum, ruthenium etc., as well as cobalt, nickel, gold, copper, cobalt or alloys.

The resistance of the stress metal spring to failure can also be increased by designing springs with varying width that increases from the tip area to the base of the finger. Most of the spring fracture during repeated touchdowns occurs near the base of the springs. Because the stress generated during contact with contact pads is, in general, the highest near the base of the spring finger, the stress near the base can be reduced substantially by increasing the width near the base area. For example, the free portion of the spring can be patterned to have a substantially trapezoidal shape. Similar increase in the failure resistance can also be achieved by making the region nearer to the spring-base thicker which, for constant applied force, also reduces the stress in the proximity of the spring-base region.

FIGS. 12a and 12b are schematic diagrams showing a particular embodiment 1200 of the springs with varying width in tapered shape, wherein 1216 refers to a fixed spring base and 1218 refers to a free portion of spring with tapering for relatively uniform stress distribution. Having the free portion 1218 of the spring tapered results in a significant increase in the failure resistance of the spring. The key point here is to shape the free portion 1218 of the spring appropriately, in this case through tapering, so that the bending stress is evenly distributed along the spring 1200. In addition, the spring compliance is increased because of tapering. This concept thus allows a design solution to maximize force at a minimum stress for a given compliance range. Note that the parallel sides at the base region (i.e., the anchor portion) can also extend into the lifted region (i.e., the free portion) to some extent, such as 1218a, before tapering begins. FIG. 12b schematically shows a buttoned and tapered spring which have been found to withstand large number of touchdowns without fracture.

In exemplary embodiments, stress metal spring core members, comprising a free portion and an anchor portion attached to the substrate, are materials with high elastic modulus, such as Mo, Mo—Cr, W, Ti—W. The core member is selectively coated, after the free portion of the spring is lifted, to cover all its exposed surfaces. The result is an envelope comprising at least one metal films deposited by electroplating without mask using metallized through hole vias in the substrate to establish electrical contact from the backside (opposite to the spring side) of the substrate. The envelope balances the stress in the free portion, and extends to the anchor portion without any discontinuity which mechanically weakens the film causing early fracture. Typically, Ni or Ni alloy is deposited onto the core member. Additional film, such as Pd alloy film is optionally electroplated onto Ni, it needed. Selective deposition of additional layer of the palladium alloy film onto the spring tip region is carried out using conventional photolithography and deposition techniques, such as electro-deposition (electroplating and/or electroless) or sputtering or CVD. Typical thickness of Mo—Cr is 4 µm. The thickness of electroplated nickel and palladium alloy films on each side of Mo—Cr film are 2–20 and 1–10 µm, typically 12 and 4 µm, respectively. In this case the elastic modulus of the films decreases from the core towards both surfaces of the spring. The thickness of the button comprising additional deposit of palladium alloy film, for example, at the contact tip region is 1–20 µm with a typical value of 12 µm.

Another aspect of this invention is to eliminate points of stress concentration on the spring surface. We have observed that often the spring failure, such as crack, is initiated at the surface during repeated touchdowns. Thus, surface roughness needs to be minimized. Much of the roughness on the sidewall of the lifted spring, as shown in FIG. 5, originates during patterning the core film, such as those composed of Mo—Cr, W or Zr—Ni for example, by wet etching. Overlying films, such as 506, subsequently deposited on the core 507 follow the rough contour of the sides, resulting in a rough surface on the side of the completed spring structure. According to this invention, forming the spring core pattern by dry etching involving ionized species minimizes this roughness. In using electroplating to build up the overlying films, the roughness is also minimized using the process of sequential plating and reverse plating (deplating) to build up the spring thickness. Reverse plating parameters are adjusted so that only a fraction of the plated thickness is removed during reverse plating. Polishing the sides of the wet etched core 507 initially or of the fully plated springs by electropolishing, chemical or electrochemical polishing can also minimize the roughness.

In another embodiment, stand-offs are provided on the substrate or electrical components so that the springs, in which the core film is covered everywhere with the overlying film deposits, are constrained to a maximum overdrive on the electrical contact pads or terminals that is allowed by the designed heights and locations of the stand-offs.

The solutions described above can also be used in the manufacturing of various other cantilever springs, which are not stress metal springs that are partially lifted as a result of the presence of an intrinsic stress gradient in the film. One of the major concerns about the performance of these other cantilever springs is also the propensity to failure, e.g. deformation or crack formation, near the base or the anchored end of the cantilever springs, as the stress in this region is the highest when the spring tip-ends are pressed into contact with the contact pads, i.e. input/output (I/O) pads of the wafer or other substrates or components of the test or burn-in assembly. Mathematical expressions are available to show the effect of spring length on the stress near the base region. In order to minimize the stress at the base region during flexing of the spring as it is pressured into contact with the contact pads, and thus increase its resistance to failure during repeated touchdowns, the length of the spring is currently designed to be relatively large, e.g. approximately 700–2,000 µm. However, this limits the applicability of cantilever springs for testing and burn-in of some of the current and future generations of ultra-miniaturized integrated circuits, for which the spring probe arrays should match the highly dense arrays of device I/O pads with tighter pitches, e.g. approximately 20–50 µm. Consequently, it is very desirable to find means to make shorter springs with tighter pitches that are strong enough, particularly near the base region to withstand higher stresses without failure.

The need for increased spring constant for applying required force at the point of spring contacts to the contact pads makes it necessary that the free portion of the cantilever type of springs be made thicker. In some embodiments, springs of higher thickness are made by electroplating one or more metals or their alloys, such as nickel or nickel alloys, or palladium alloys, on photo-lithographically patterned free standing spring core such as Mo—Cr alloy. In some other embodiments, the springs are patterned, using photo-lithography, and fabricated by electroplating relatively thick layers of at least one metal or metal alloy films, e.g. nickel or nickel alloys, on seed layers. In many of these embodiments, button type contact structures are also provided at the contact tip regions to improve the contact properties and maintain the contact integrity during repeated touchdowns at the time of wafer testing and burn-in operations. However, such embodiments still require relatively thick films for constructing the main body of the springs in order to apply the required contact force at the contact tip end. For relatively shorter springs, which are approximately 100–700 μm long, the increased spring thickness results in higher stresses near the base end, resulting in a lower spring lifetime.

Described below are solutions for manufacturing shorter cantilever type of springs with or without buttons like contact structures at the spring tip regions, in which the strength at the springs' base or main body regions is strengthened against mechanical failure, resulting in a significant enhancement of the performance, strength, durability, and lifetime of such springs.

Figure 14A:
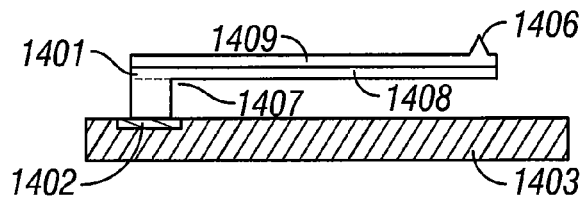
FIG. 14a and FIG. 14b are schematic diagrams illustrating two cross sectional views of typical freestanding non-stress metal cantilever springs according to one embodiment of the invention.
Figure 14B:
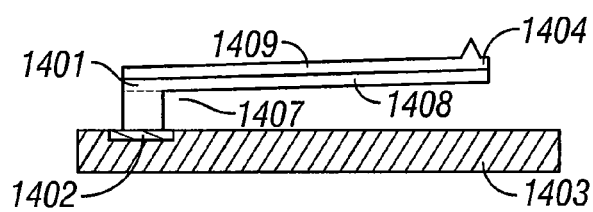

FIGS. 14a and 14b illustrate two cross-sectional views of a typical freestanding non-stress metal cantilever spring according to one embodiment of the invention. The freestanding cantilever spring comprises a base region 1401 at one end that is attached to an electrical contact pad 1402 of a substrate 1403, a contact tip region 1404 at the other end of the spring, a button 1406 together with the contact tip region 1404, and a main body deposited with a Ni film 1408 and a Pd-alloy film 1409. The spring length can be substantially parallel to the surface of the substrate it is attached to, or it can extend away from the substrate surface making an oblique angle to the surface. Typically the base 1401, the tip 1404 and the main body of the spring are fabricated with the same materials in the same operation, for example, by using thin film deposition techniques such as electroplating, sputtering, or CVD.

The contact tip region 1404 comprises a button type contact structures 1406 for facilitating reliable and durable contacts, which may be fabricated by selectively depositing films on the contact tip region 1404 as an integral part of the tip region or separately fabricated and affixed to the tip region. Similarly, the base region 1401 may be attached to a post that may be integrally fabricated with the spring, or fabricated separately and joined to the base using conventional techniques, such as soldering, brazing and etc. For the integral fabrication of the posts, films may be selectively deposited, using techniques such as electroplating, into holes within sacrificial substrates, followed by polishing.

The presence of button type contact structures 806 at the spring tip regions 1404 is useful for achieving reliable and durable electrical contacts to the opposing contact pads in a wafer test or burn-in assembly. In that case, appropriate materials with desirable contact characteristics and thickness can be selected for constructing such buttons which are not necessarily, but can also comprise, the same materials that comprise the main body 1405 or base 1401 of the spring. However, selections of the materials for each of the three parts must be such that they impart robustness to all parts of the springs allowing them to withstand the wafer test and burn-in process including repeated touchdowns without failure. Many materials suited for various electroplating applications have been used in making the cantilever type of springs. Such materials include, for example, nickel and its alloys, gold, rhodium, Pd and its alloys, copper, elements of platinum group and their alloys, titanium, molybdenum and their alloys etc. However, challenges to make shorter springs with the required robustness still remain. Non-stress metal cantilever springs manufactured today are still relatively long, for example 1–2 mm. A major objective in the field is to find a means to fabricate arrays of much shorter and robust springs to support the continuing drive of the microelectronic industry to produce deep sub-micron integrated circuits with greater circuit density and concomitant smaller pitch between input/output terminals.

This invention makes it possible that arrays of such robust contact springs are fabricated by applying specific material selection principles for the construction of the buttoned or non-buttoned springs, which comprises metal films. Selection of the appropriate materials by applying these principles provides particular methods of film deposition and thus results in the fabrication of contact springs with the desired robustness.

A specific material selection principle that has been found to have a highly significant effect in improving the performance and reliability of the springs is as follows. The multilayer films comprising the three parts, i.e., a base, a tip region, and a body, of the spring and the button should have a graded material composition so that the films with lower elastic modulus are deposited near the spring surface that makes contacts with the IC terminals for testing, and films with increasingly higher modulus are deposited towards the opposite surface. The mechanical strength of the button is not as critical a factor as the mechanical strength of the main body and base region of the springs for determining the robustness of the springs. However, based on the teachings of this invention, the button films can also be optionally selected and deposited, if needed, in such a way that the modulus of the film at the button surface has lower elastic modulus than the underlying film layers, the modulus of which increases progressively away from the button surface. Such a graded transition in compositions and elastic modulus from the spring contact surface to the opposite surface, either continuously or in discrete steps across an interface between two different materials can be used to distribute the stresses at critical locations, and thus suppress damages to the spring. As a result the lifetime of springs increases. This increases the resistance to mechanical failure in the spring everywhere including the base 801 of the spring as the spring tips 804 are pressed into contact with the contact pads on another substrate, such as semiconductor wafers or other components of a test or burn-in assembly.

According to the above principle, one exemplary embodiment of the non-stress metal cantilever springs comprises nickel film as a base layer with palladium-approximately 20% cobalt or palladium-approximately 20% nickel alloy film as the overlayers, because nickel has a higher elastic modulus than that of the palladium alloys. Other films may also be deposited to form the multilayer springs, as long as the selection principle is applied, in general, to determine the deposition sequence. Additionally, very thin film layers may also be deposited in between two major film layers, as needed, to improve the interface strength or adhesion. For example, a gold or nickel or rhodium strike can be used for this purpose, as is well known to persons skilled in the art. In this case, the button 1406 on the tip region 1404 can comprise additional layers of films of the said palladium alloy. The button 1406 may be fabricated as an integral part of the contact tip region 1404 or separately affixed to the tip region 1404.

Such springs as illustrated in FIGS. 14*a* and 14*b* are typically deposited on sacrificial layers, which are subsequently removed to provide the freestanding cantilever springs. The substrate 1403 may also have multilayer metallization and an electrically conducting blind vias or through-vias, as 502 shown in FIG. 5. The films 1408 and 1409 and other additional layers are deposited by conventional techniques such as electroplating. A suitable thin adhesion promoting layer and/or a seed layer, comprising materials such as titanium, may also be deposited prior to the deposition of the electroplated layer, as needed. The thickness of the respective film layers is determined by the desired contact force or spring constant, which can be calculated from various mathematical expressions. Various spring dimensions can be used, 1–50 μm as thickness range for example, based on design requirement, for example, regarding force and pitch. Taking an overall spring thickness of 30 μm as an illustration, the nickel and the palladium alloy thicknesses in the present embodiment can be 25 μm and 5 μm respectively. Thickness of the additional layer of palladium alloy in the button in this case can be 3–20 μm. It is to be appreciated that the above numbers are used for examples only. A wide variation in the numbers works well for ensuring the robustness of the springs, as long as the basic principle is satisfied.

In another exemplary embodiment, the core film is made of molybdenum-chromium alloy or titanium-tungsten or molybdenum-tungsten, with sequentially deposited overlayers of nickel and palladium alloy films. In this case, the button 1406 on the tip region 1404 comprises, as above, additional deposited thickness of the said palladium alloy. The button 1406 may be fabricated by selectively depositing, using photolithography, the additional thickness of palladium alloy film onto the tip region 1404. The discussion on exemplary thickness range, deposition techniques, adhesion promoting layer and seed layer and etc., in the preceding paragraph also applies to this case.

As discussed earlier, the films of the above embodiments of non-stress metal cantilever springs can be preferentially deposited with compressive stress to further improve robustness. The robustness is also further improved by selecting the film deposition parameters appropriately so that the grain size of the films are very small, e.g. 3–500 nm. Examples of such deposition parameters include, for example, additive concentration in the electroplating bath, current density, and temperature.

The disclosed interconnection apparatus and associated fabrication methods are suitable for various applications, including but not limited to testing of electronic components, wafer level burn-in and packaging of electronic devices. The said electronic components comprise devices such as integrated circuits, liquid crystal displays, MEMS, as well as printed circuit boards, or any combinations thereof. Packaging includes joining and establishment of electrical connections between two components or substrates, using the disclosed contact spring elements, where joining may be accomplished with or without the use of solders or conductive adhesives.

Abbreviations for Metric Terms and Chemical Elements:
μm—micron=$10^{-6}$ meter;
nm—nanometer, or millimicron=$10^{-9}$ meter;
Ag—Silver;
Al—Aluminum;
Au—Gold;
Co—Cobalt;
Cr—Chromium;
Cu—Copper;
Mo—Molybdenum;
Ni—Nickel;
Pb—Lead;
Pd—Palladium;
Pt—Platinum;
Rh—Rhodium;
Ru—Ruthenium;
Sn—Tin;
Ti—Titanium;
W—Tungsten.

This invention applies to all type of miniaturized springs. The preferred embodiments disclosed herein have been described and illustrated by way of example only, and not by way of limitation. Other modifications and variations to the invention will be apparent to those skilled in the art from the foregoing detailed disclosure. While only certain embodiments of the invention have been specifically described herein, it will be apparent that numerous modifications may be made thereto without departing from the spirit and scope of the invention.

Accordingly, the invention should only be limited by the claims included below.

The invention claimed is:

1. An interconnection apparatus for establishing electrical contact between two components, said apparatus comprising:
   a plurality of elastic core members, each core member of said plurality of core members having an anchor portion attached to a substrate and a free portion, initially attached to said substrate, which, upon release, extends to a lift height away from said substrate due to an inherent stress gradient in said each core member;
   said each core member having all exposed surfaces enveloped without any discontinuity with one or more electrodeposited coatings, said one or more coatings having a combined thickness greater than that of said core member and balanced internal stresses, wherein lift height variations among said plurality of core members are minimized and wherein a predetermined increase in the spring constant of said core members is provided to lower electrical contact resistance between said two components to within a predetermined range.

2. The interconnection apparatus of claim 1, wherein said envelope comprises electroplated films.

3. The interconnection apparatus of claim 1, wherein said free portion is substantially tapered having a width that gradually decreases towards the probe tip over a substantial length of the free portion.

4. The interconnection apparatus of claim 1, wherein said free portion is substantially trapezoidal in shape.

5. The interconnection apparatus of claim 1 wherein said coating is an electrical conductor.

6. The interconnection apparatus of claim 1, wherein said coating is selected from the group of materials comprising any of nickel, platinum group materials which comprise any of palladium, platinum rhodium, ruthenium, osmium, iridium, and, gold, silver, copper, cobalt, tungsten, and any of their alloys.

7. The interconnection apparatus of claim 1, wherein the average grain size of at least one of said at least one electrodeposited coating ranges from 3 to 500 nm.

8. The interconnection apparatus of claim 1, wherein at least one of said coating remains under compressive stress.

9. The interconnection apparatus of claim 1, wherein grains of at least one said coating are substantially equiaxed with an average ratio of long to short dimensions of about 2 or less.

10. The interconnection apparatus of claim 1, wherein at least one of said at least one coating has a lower elastic modulus than the said core that it surrounds.

11. The interconnection apparatus of claim 1, wherein said substrate comprises any of ceramic, glass, silicon, quartz and organic materials.

12. The interconnection apparatus of claim 1, wherein said each core member comprises any of Mo, Cr, Ti, W, Zr, Ti—W, and Mo—Cr.

13. The interconnection apparatus of claim 1, wherein the thickness of the electrodepositedly enveloped free portion ranges from 1 to 45 microns.

14. The interconnection apparatus of claim 1, wherein the thickness of each of said at least one coating ranges from 0.1 to 20 microns.

15. The interconnection apparatus of claim 1, wherein said free portion has a size ranging from 10 µm to 1000 µm in length, 3 µm to 500 µm in width, and 0.1 µm to 40 µm in thickness.

16. The interconnection apparatus of claim 1, wherein the outermost layer of said at least one coating is selected from the group consisting of copper, gold, nickel, and platinum group materials.

17. The interconnection apparatus of claim 1, wherein the envelope comprises a plurality of different and sequentially electrodeposited films.

18. The interconnection apparatus of claim 17, wherein the electrodeposited films are deposited in such a manner that the elastic modulus of the deposited films generally decrease progressively from the innermost core toward an outermost surface.

19. The interconnection apparatus of claim 17, wherein the elastic modulus of said electrodeposited films decreases substantially discreetly from the innermost core toward an outermost surface.

20. The interconnection apparatus of claim 1, further comprising:
a film layer selectively dispensed at a probe tip area onto said electrodepositedly enveloped core member.

21. The interconnection apparatus of claim 20, wherein the film layer is deposited by electroplating.

22. The interconnection apparatus of claim 21, wherein the film layer is selected from the group consisting of palladium, rhodium, platinum, iridium, osmium, ruthenium, and cobalt, nickel, gold, copper, silver, and their alloys.

23. An interconnection device comprising:
a plurality of elastic core members, each core member having an anchor portion attached to a substrate, said substrate having metallization comprising metallized through-vias, which are electrically connected to corresponding core member anchor portions, and further having a free portion, initially attached to said substrate, which, upon release, extends away from said substrate due to an inherent stress gradient in said each core member;
said each core member having all exposed surfaces enveloped without any discontinuity with one or more coatings, said one or more coatings having a combined thickness greater than that of said core member and balanced internal stresses, wherein lift height variations among said plurality of core members are minimized.

24. The device of claim 23, wherein said substrate comprises any of ceramic, glass, quartz, silicon, and organic material.

25. The device of claim 23, wherein said each core member comprises any of Mo, Cr, W, Ti, Zr, Mo—Cr, and Ti—W.

* * * * *

UNITED STATES PATENT AND TRADEMARK OFFICE
CERTIFICATE OF CORRECTION

| | | |
|---|---|---|
| PATENT NO. | : 7,126,220 B2 | Page 1 of 1 |
| APPLICATION NO. | : 10/390988 | |
| DATED | : October 24, 2006 | |
| INVENTOR(S) | : Syamal Kumar Lahiri et al. | |

It is certified that error appears in the above-identified patent and that said Letters Patent is hereby corrected as shown below:

Please insert the following caption to Column 1, Line 6, above "Cross-Reference to Related Applications"

--This invention was made with United States Government support under Cooperative Agreement 70NANB8H4008 awarded by NIST. The United States Government has certain rights in this invention.--

Signed and Sealed this

Sixteenth Day of January, 2007

JON W. DUDAS
*Director of the United States Patent and Trademark Office*